US010178779B2

(12) United States Patent
Lee et al.

(10) Patent No.: US 10,178,779 B2
(45) Date of Patent: Jan. 8, 2019

(54) DISPLAY APPARATUS

(71) Applicant: LG ELECTRONICS INC., Seoul (KR)

(72) Inventors: Nari Lee, Seoul (KR); Youngsoo Han, Seoul (KR); Jongho Kim, Seoul (KR); Sunha Park, Seoul (KR); Jonghyun Byeon, Seoul (KR); Youngkyoung Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/265,337

(22) Filed: Sep. 14, 2016

(65) Prior Publication Data

US 2017/0079149 A1 Mar. 16, 2017

(30) Foreign Application Priority Data

Sep. 14, 2015 (KR) ........................ 10-2015-0129555

(51) Int. Cl.
*H05K 5/00* (2006.01)
*G02F 1/01* (2006.01)
*G02F 1/1333* (2006.01)
*H01L 51/52* (2006.01)
*H05K 5/03* (2006.01)

(52) U.S. Cl.
CPC ......... *H05K 5/0017* (2013.01); *G02F 1/0147* (2013.01); *G02F 1/133308* (2013.01); *H01L 51/524* (2013.01); *H01L 51/5284* (2013.01); *H05K 5/03* (2013.01); *G02F 2001/133322* (2013.01); *G02F 2001/133331* (2013.01)

(58) Field of Classification Search
CPC ..................................................... H05K 5/006
See application file for complete search history.

(56) References Cited

U.S. PATENT DOCUMENTS 7,760,289 B2 * 7/2010 Nakanishi ............. G06F 1/1616
349/58
2007/0279243 A1 12/2007 Araki et al.
2010/0277439 A1 * 11/2010 Charlier ................ G06F 1/1616
345/176
2011/0133674 A1 6/2011 Yoo

FOREIGN PATENT DOCUMENTS

| CN | 1344960 A | 4/2002 |
| CN | 101334547 A | 12/2008 |
| CN | 202976766 U | 6/2013 |
| CN | 204362190 U | 5/2015 |
| KR | 1020140073754 A | 6/2014 |
| WO | 2015/081714 A1 | 6/2015 |

* cited by examiner

*Primary Examiner* — Jeremy C Norris
(74) *Attorney, Agent, or Firm* — Dentons US LLP

(57) ABSTRACT

A display apparatus is disclosed. The display apparatus according to the present invention comprises a display panel with which a source PCB is combined in one side; a rear cover disposed in a rear surface side of the display panel; and a housing supporting at least one of the display panel and the rear cover from a lower surface side of the display panel and being equipped with at least one PCB, wherein the rear cover is made of transparent material through which light passes and at least one penetrating hole corresponding to at least one area of the source PCB is formed in at least one area of the rear cover. According to the present invention, the display panel and the rear cover can be combined easily with each other.

19 Claims, 22 Drawing Sheets

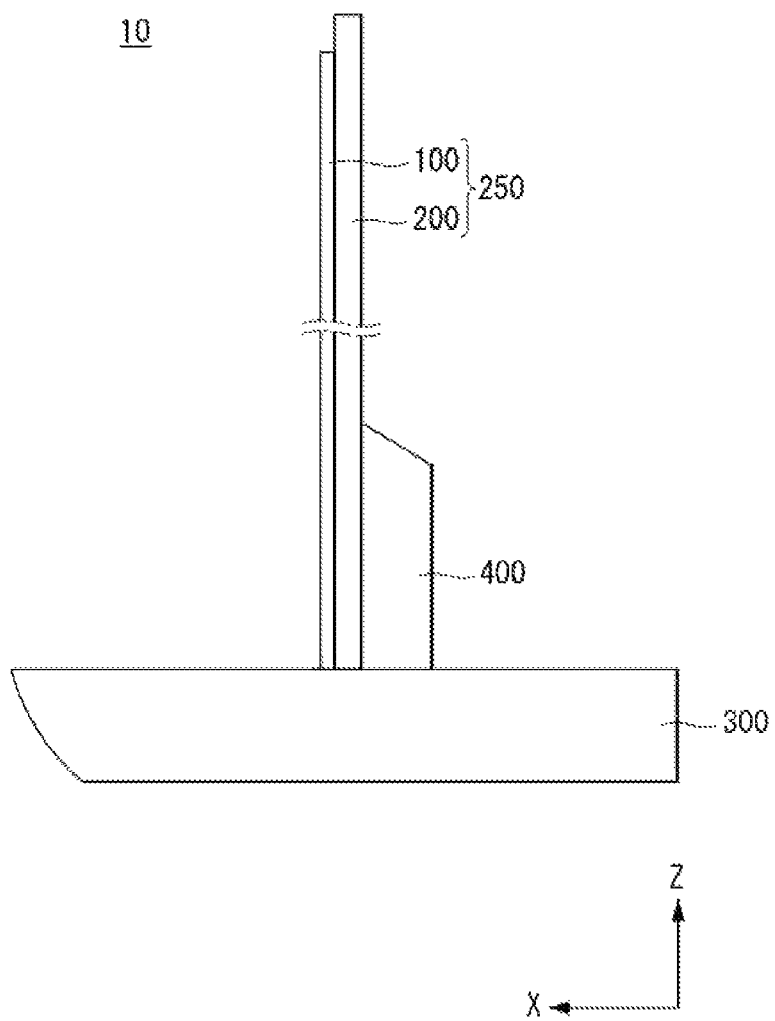
[Figure 1]

[Figure 2]
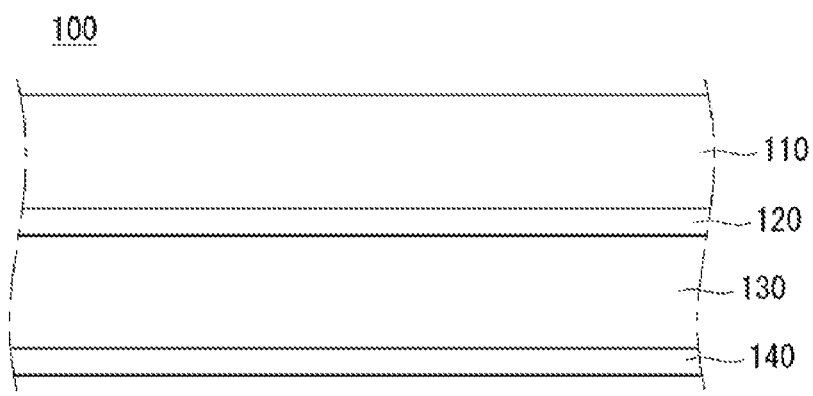

【Figure 3】
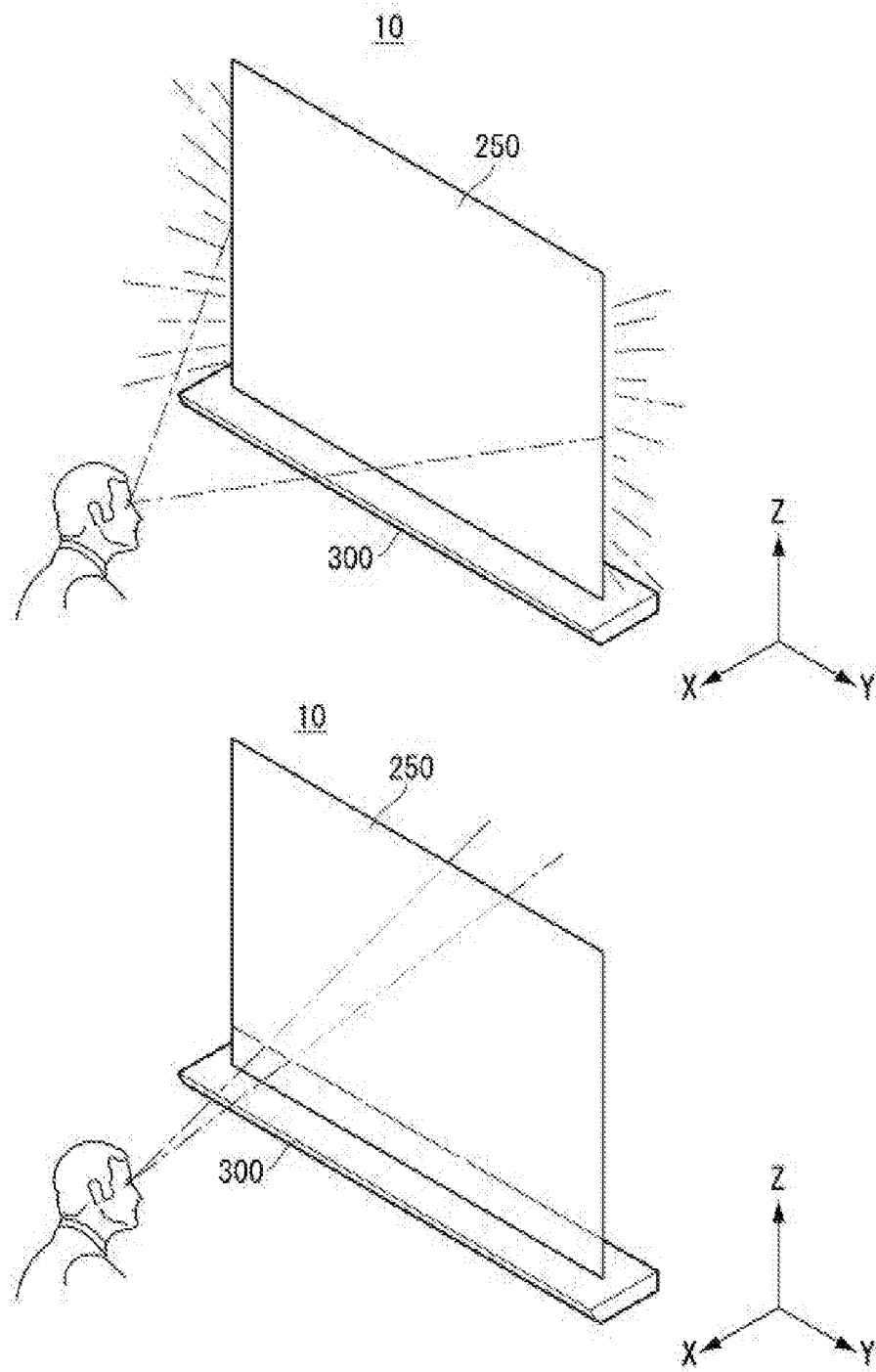

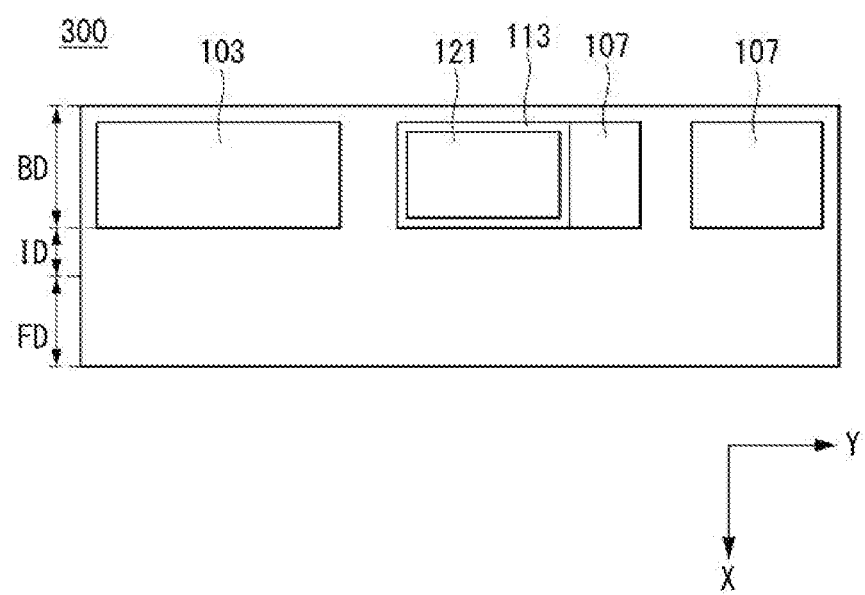
[Figure 4]

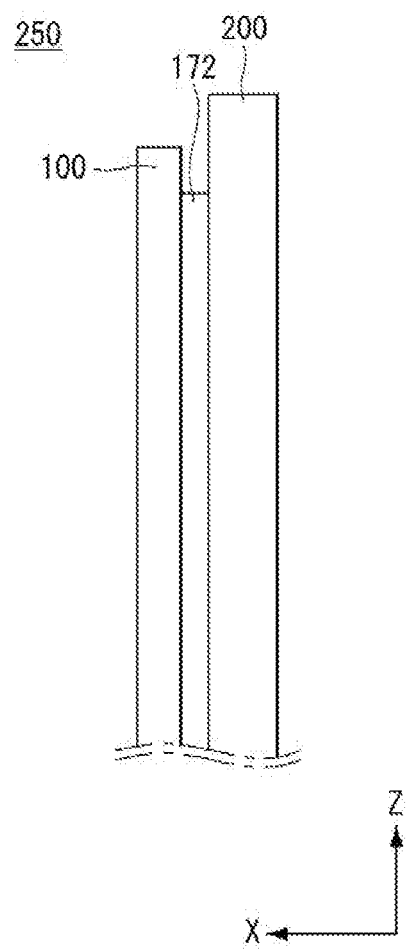
[Figure 5]

【Figure 6】
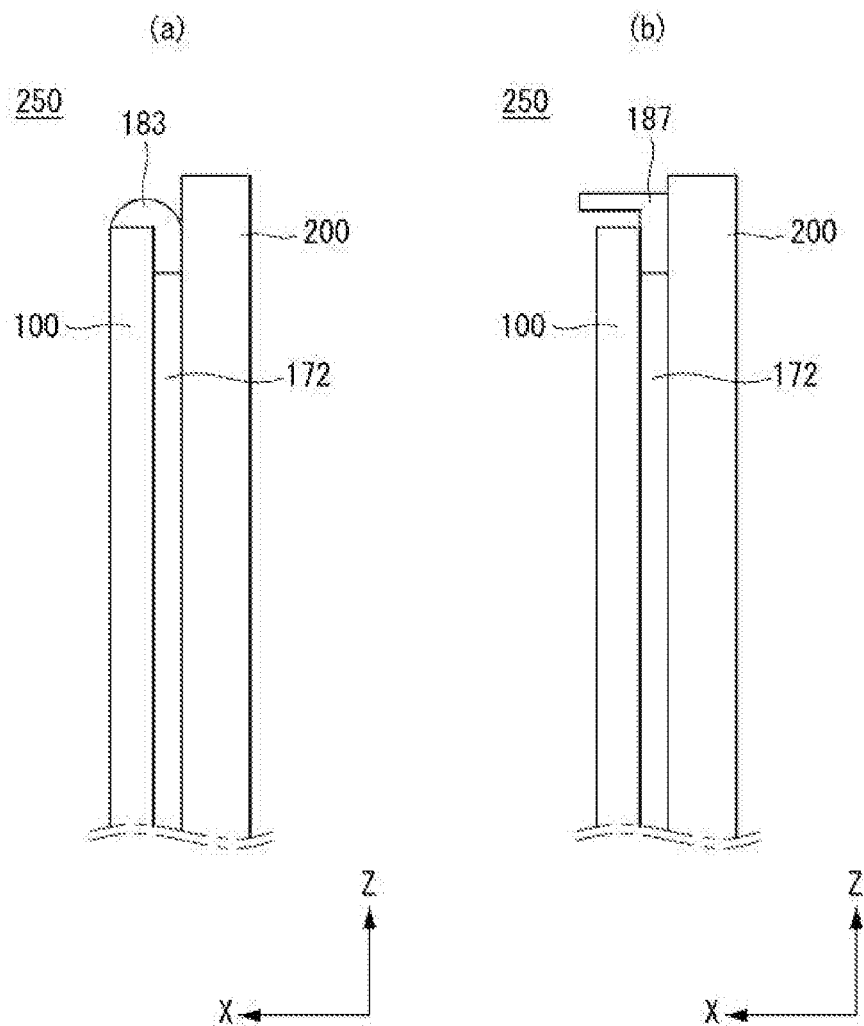

[Figure 7]
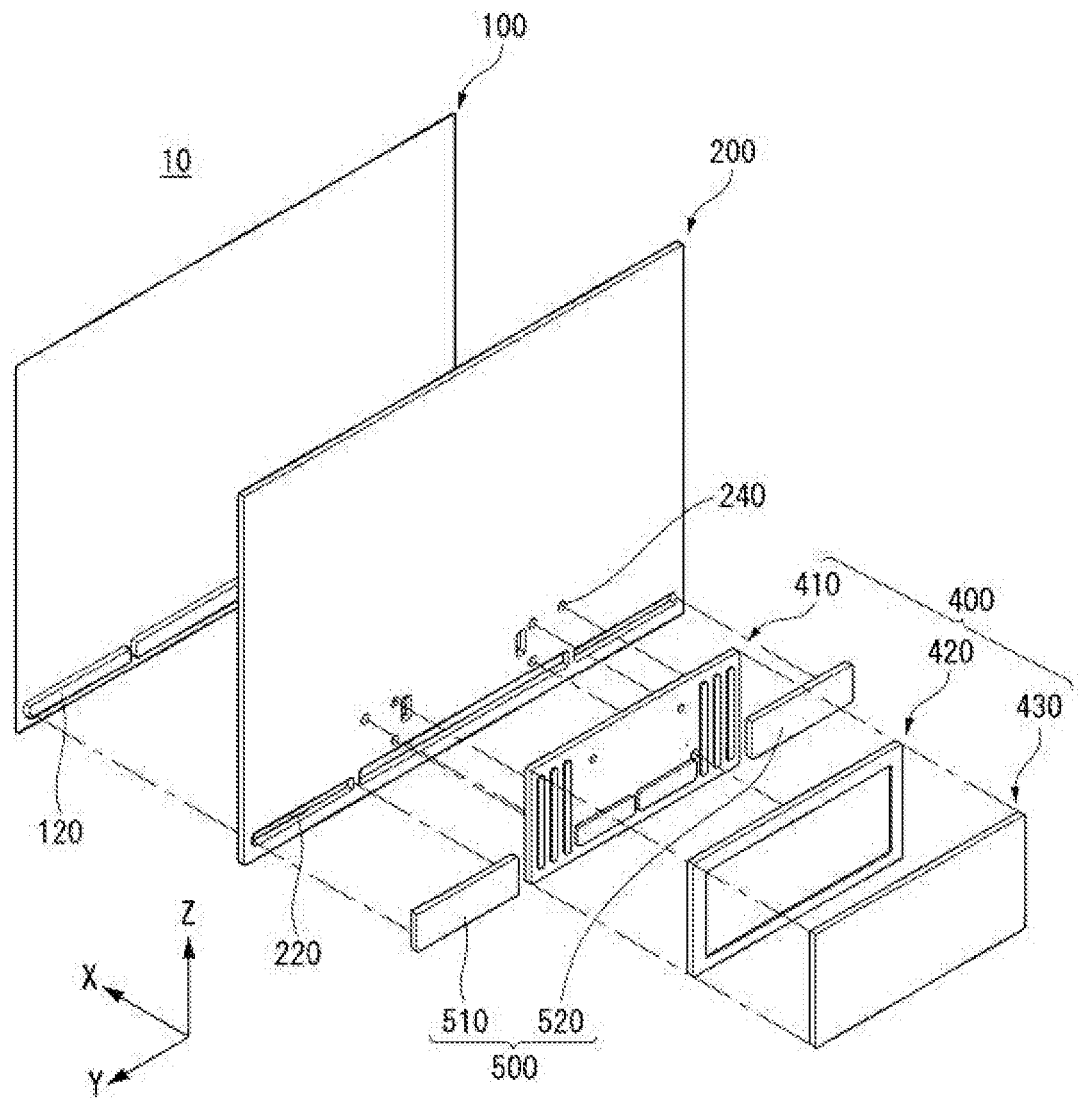

[Figure 8]
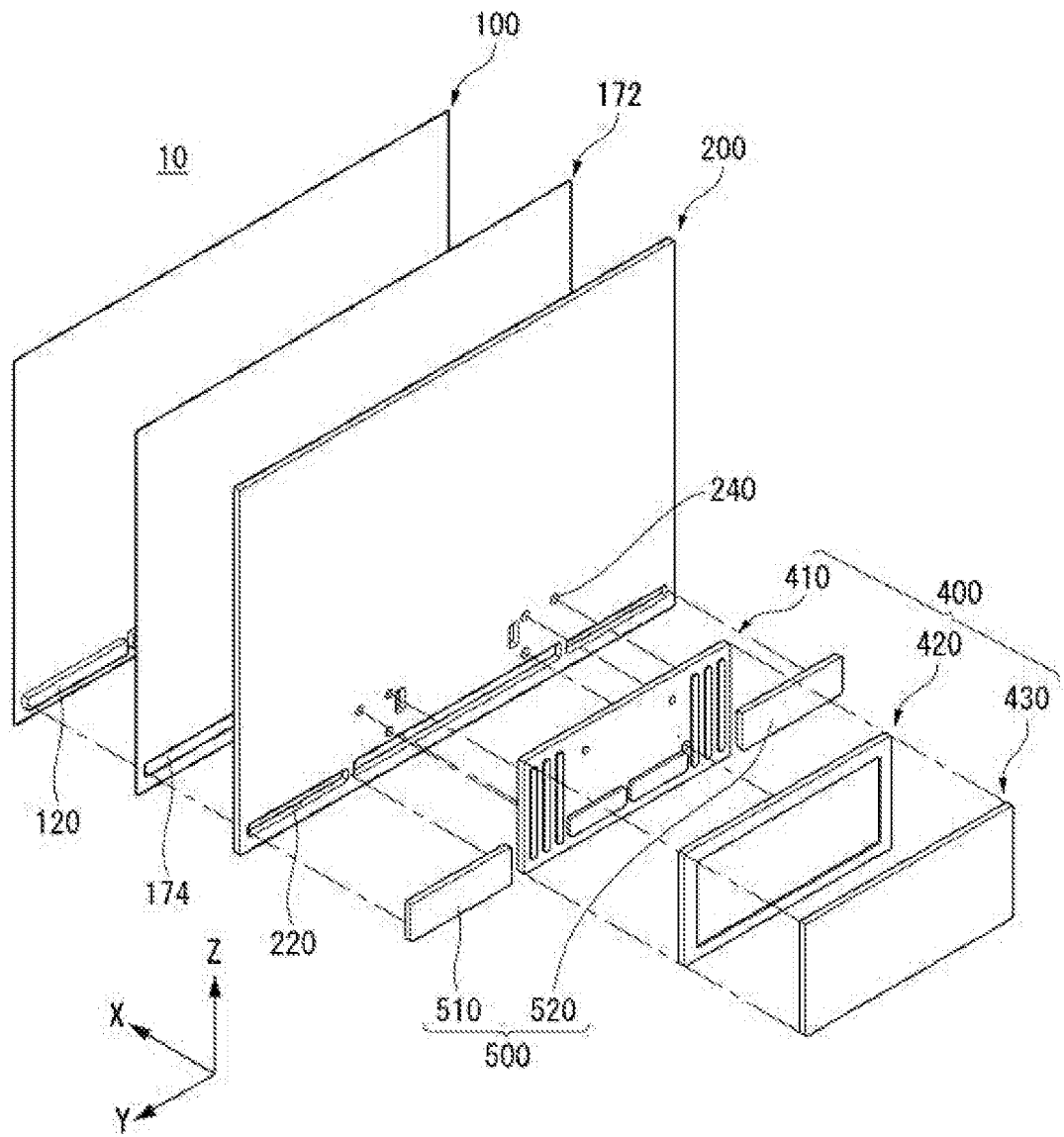

[Figure 9]
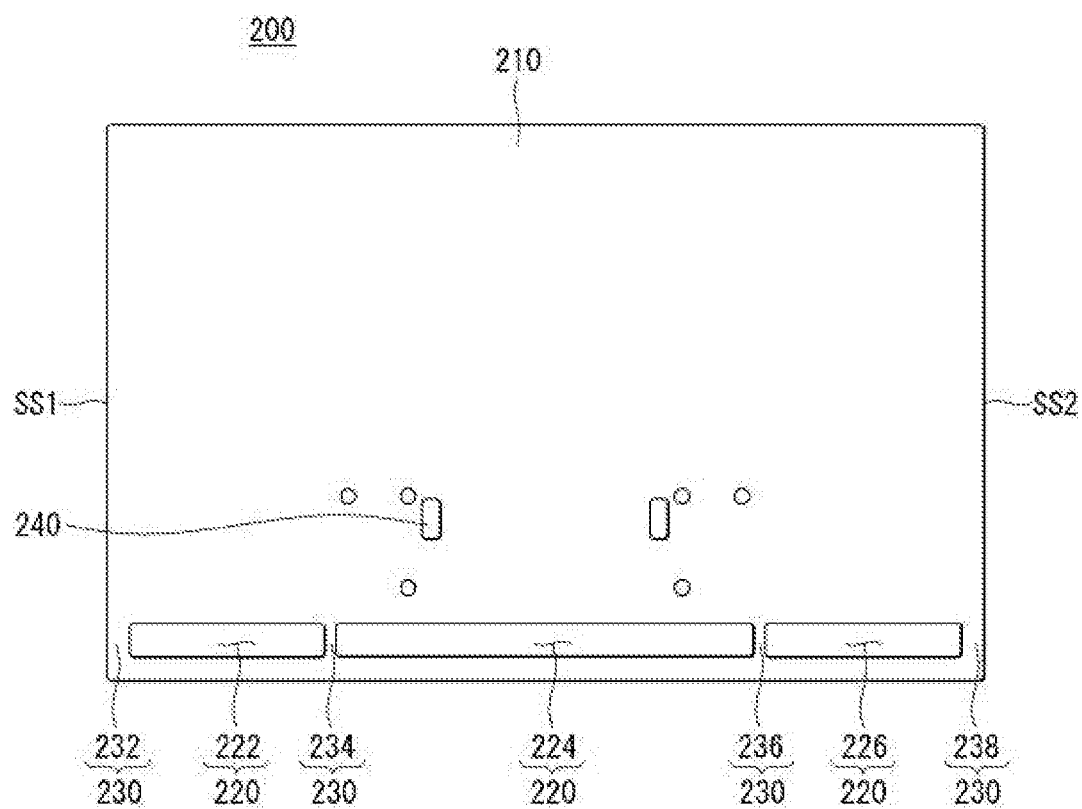

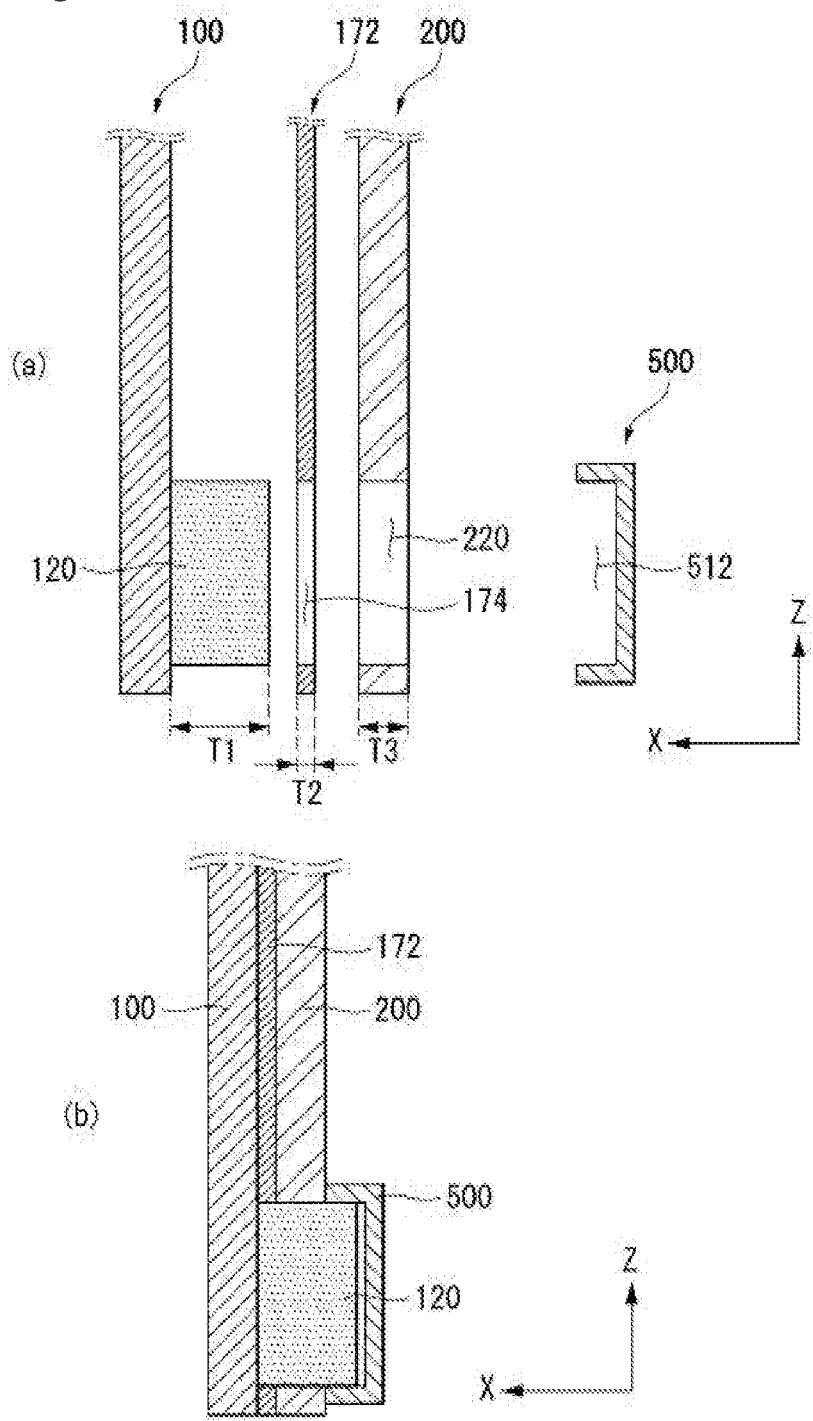
[Figure 10]

【Figure 11】
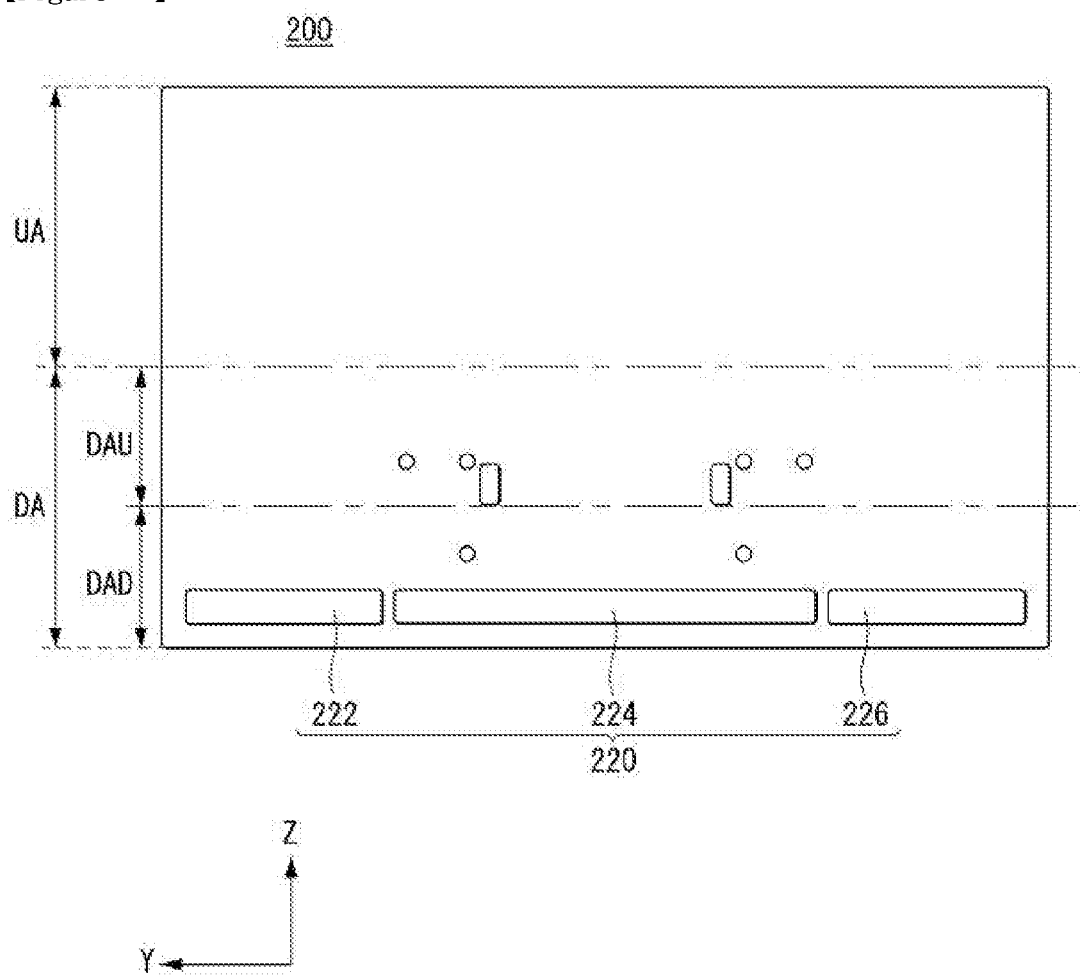

[Figure 12]
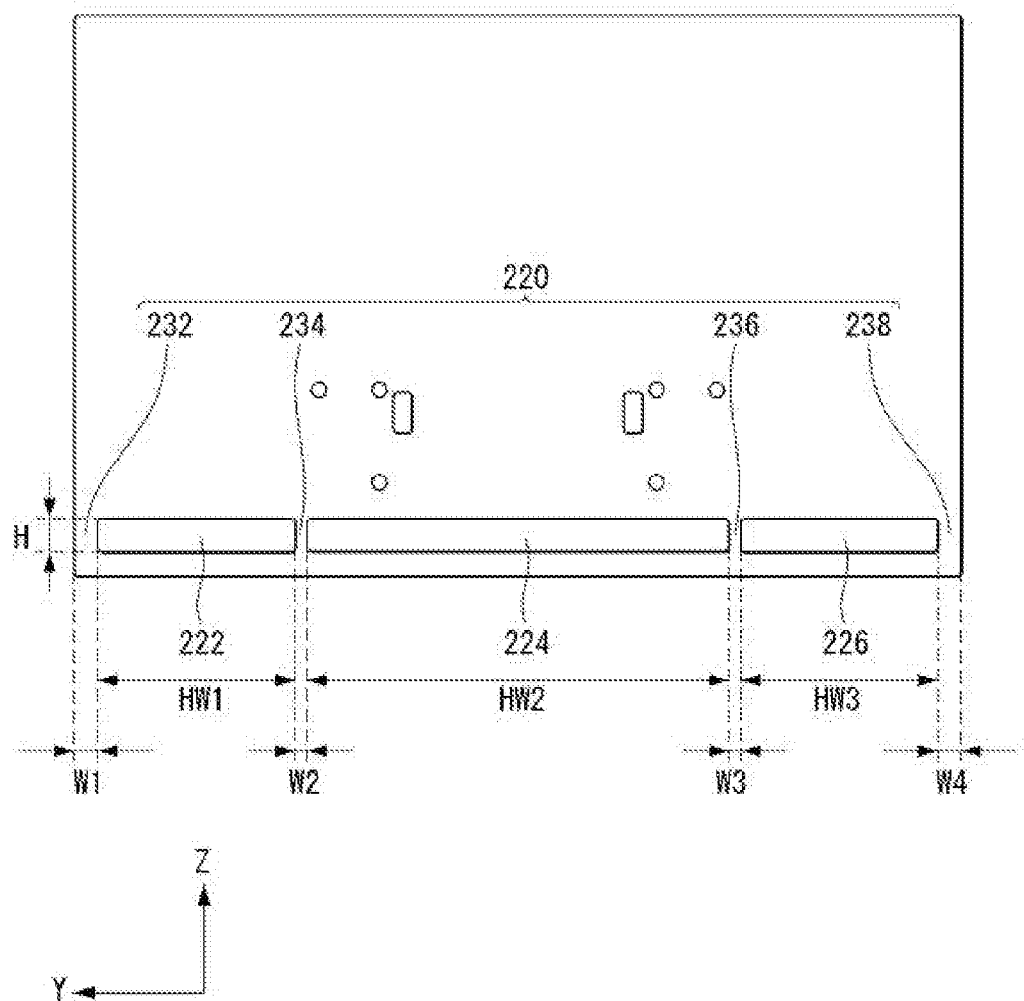

【Figure 13】
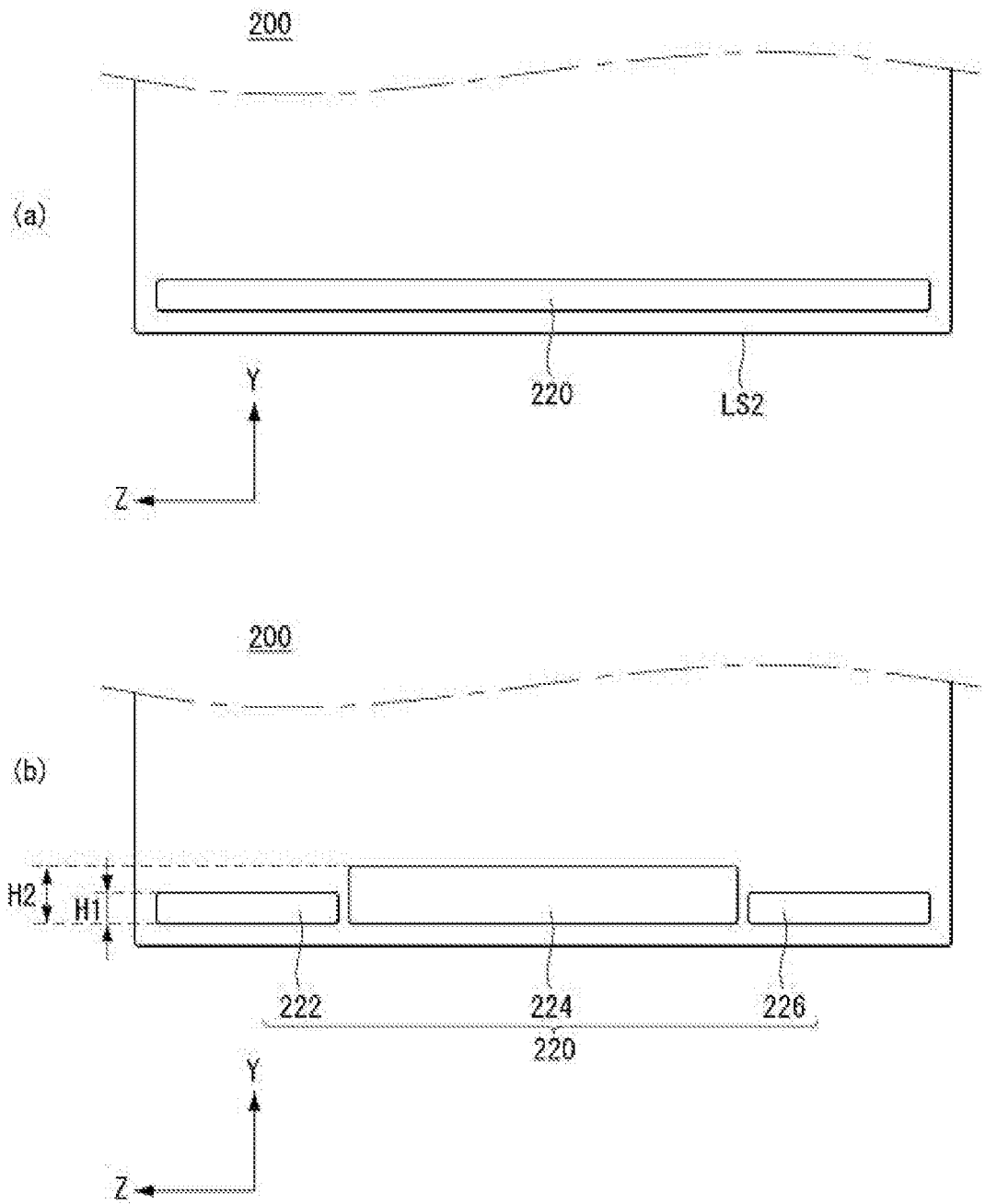

[Figure 14]
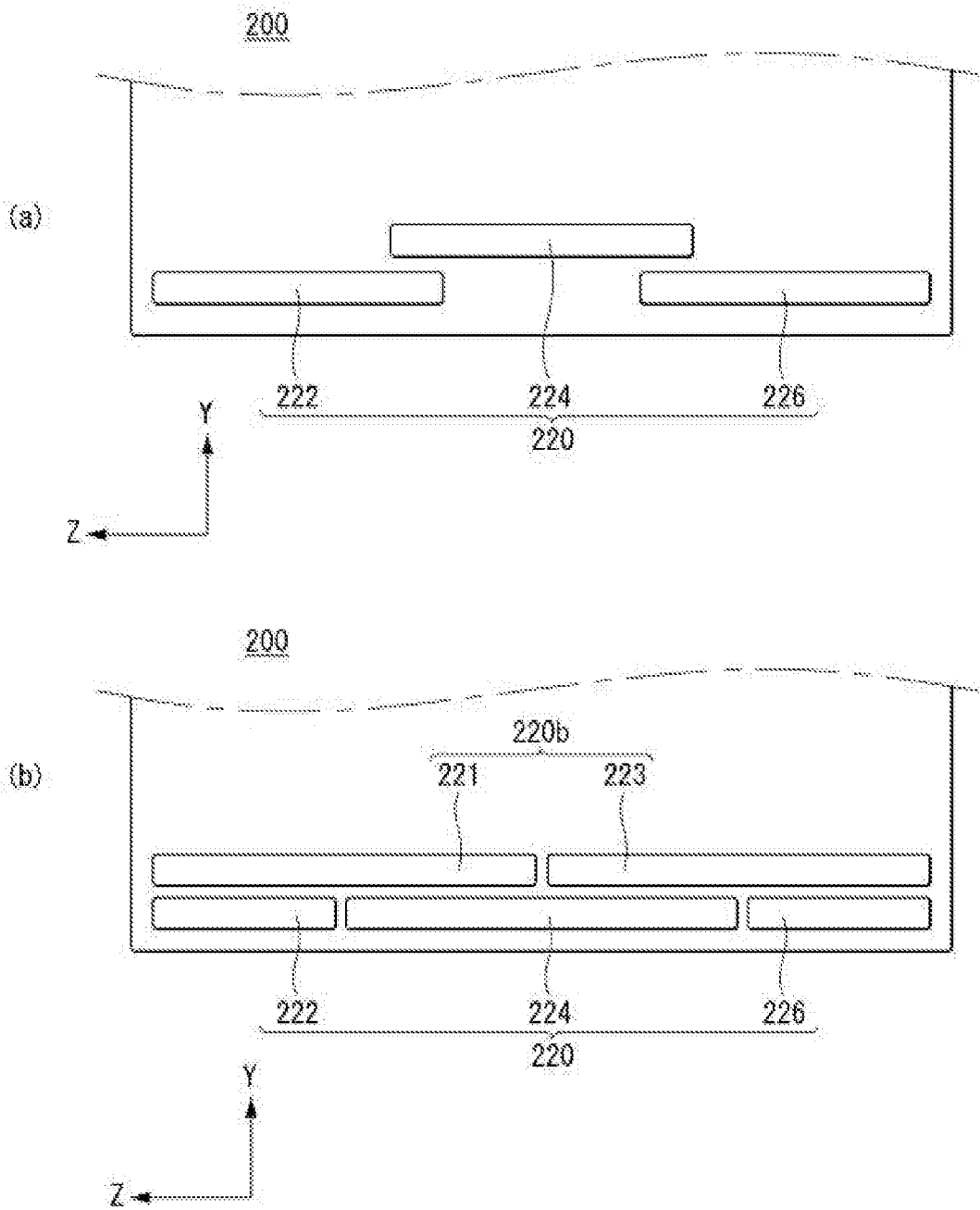

[Figure 15]
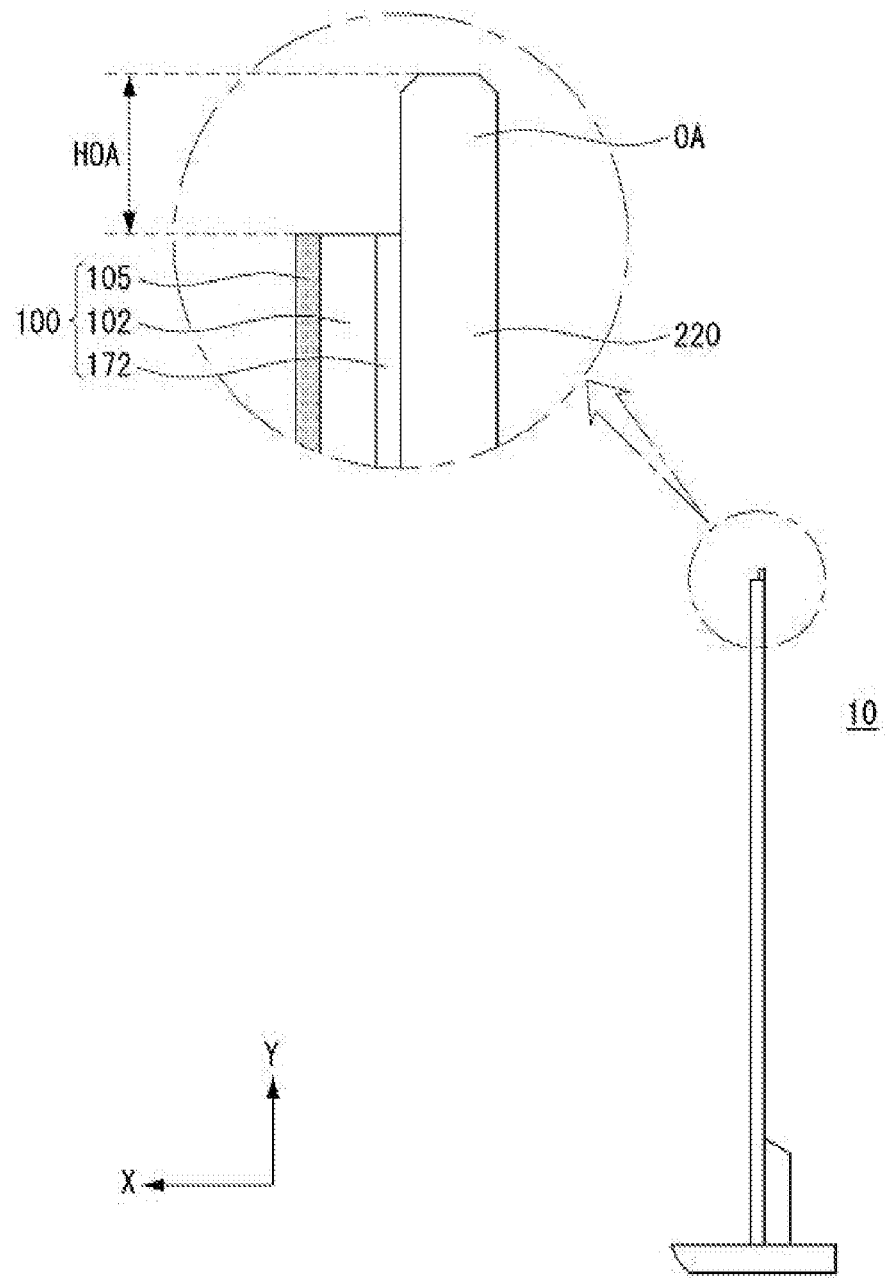

[Figure 16]
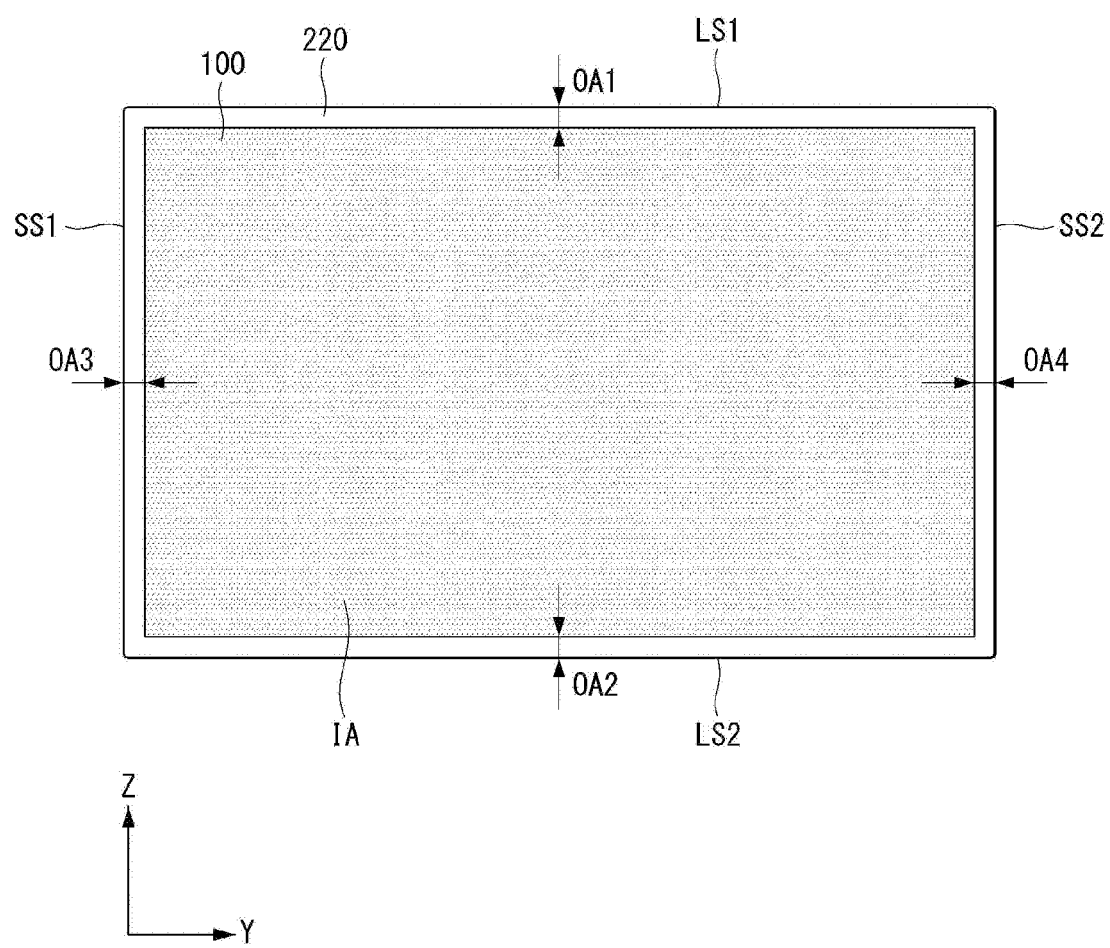

【Figure 17】
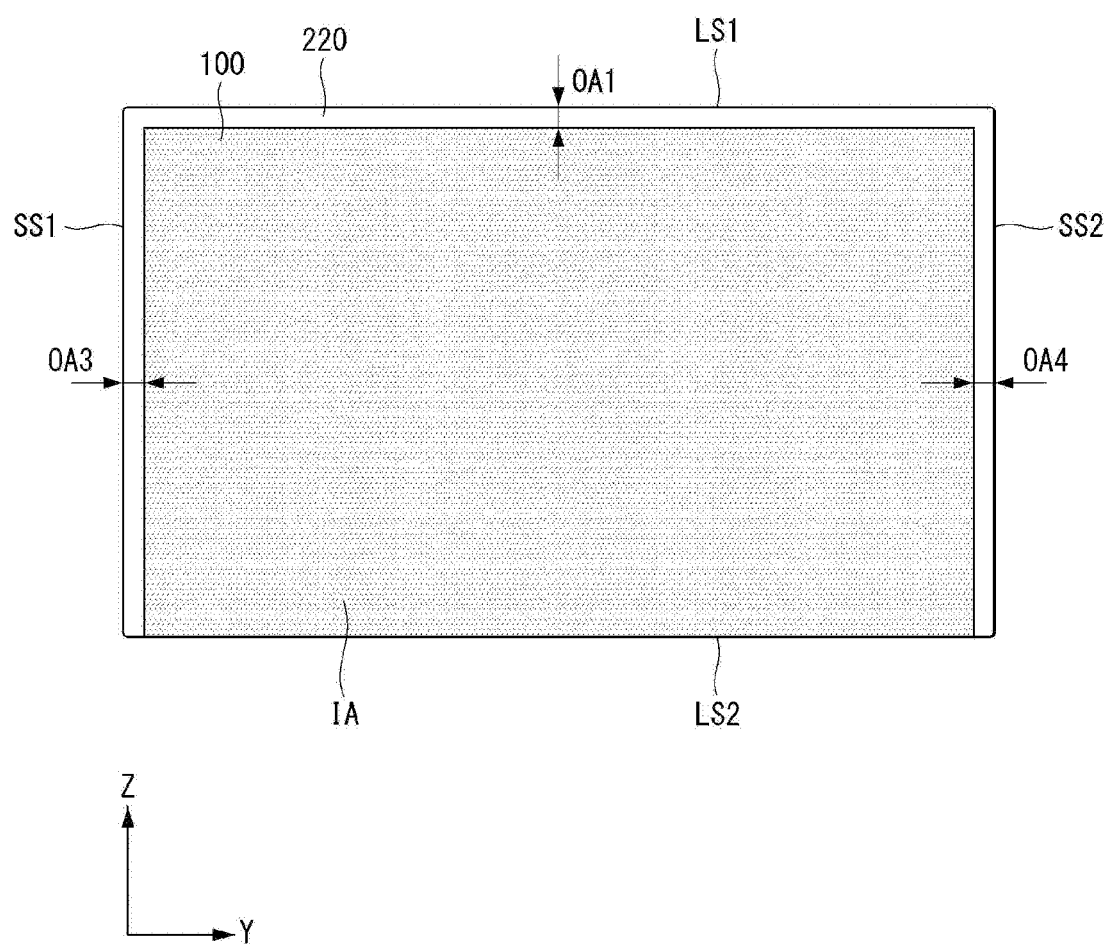

[Figure 18]
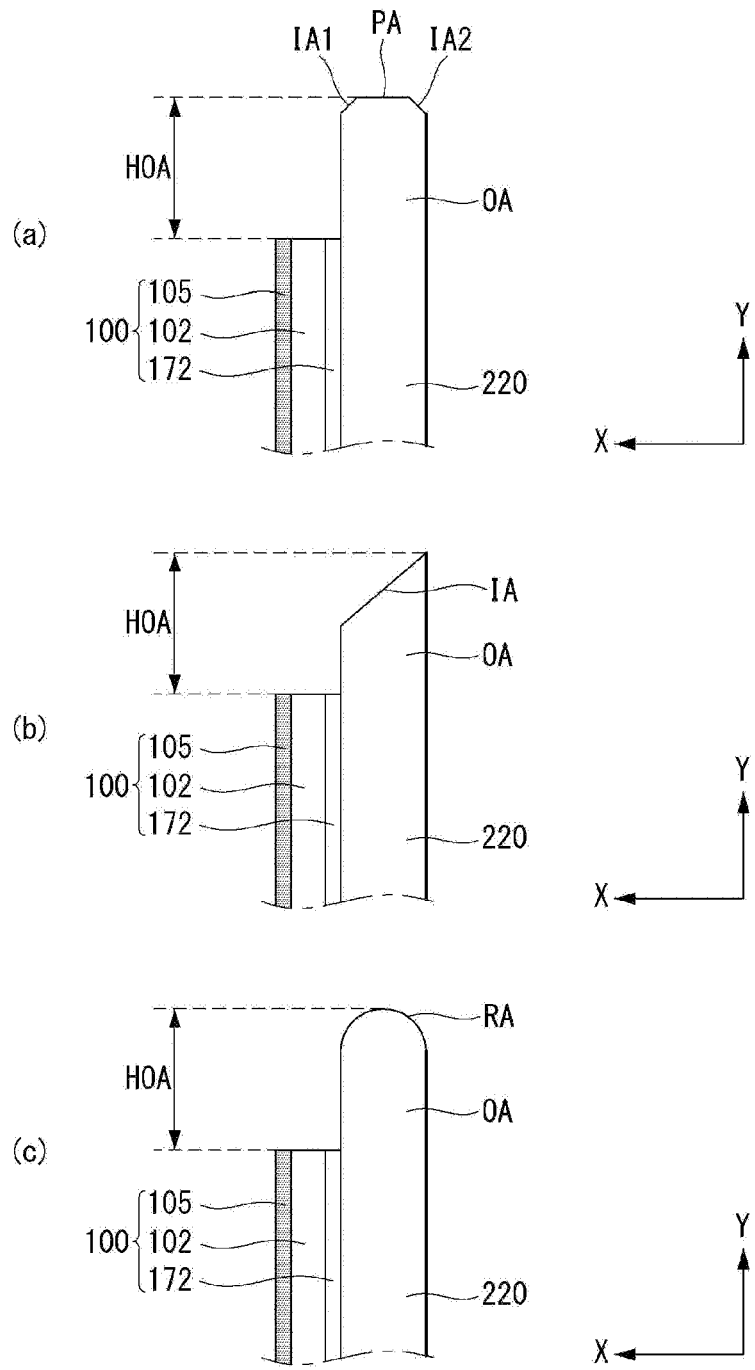

[Figure 19]
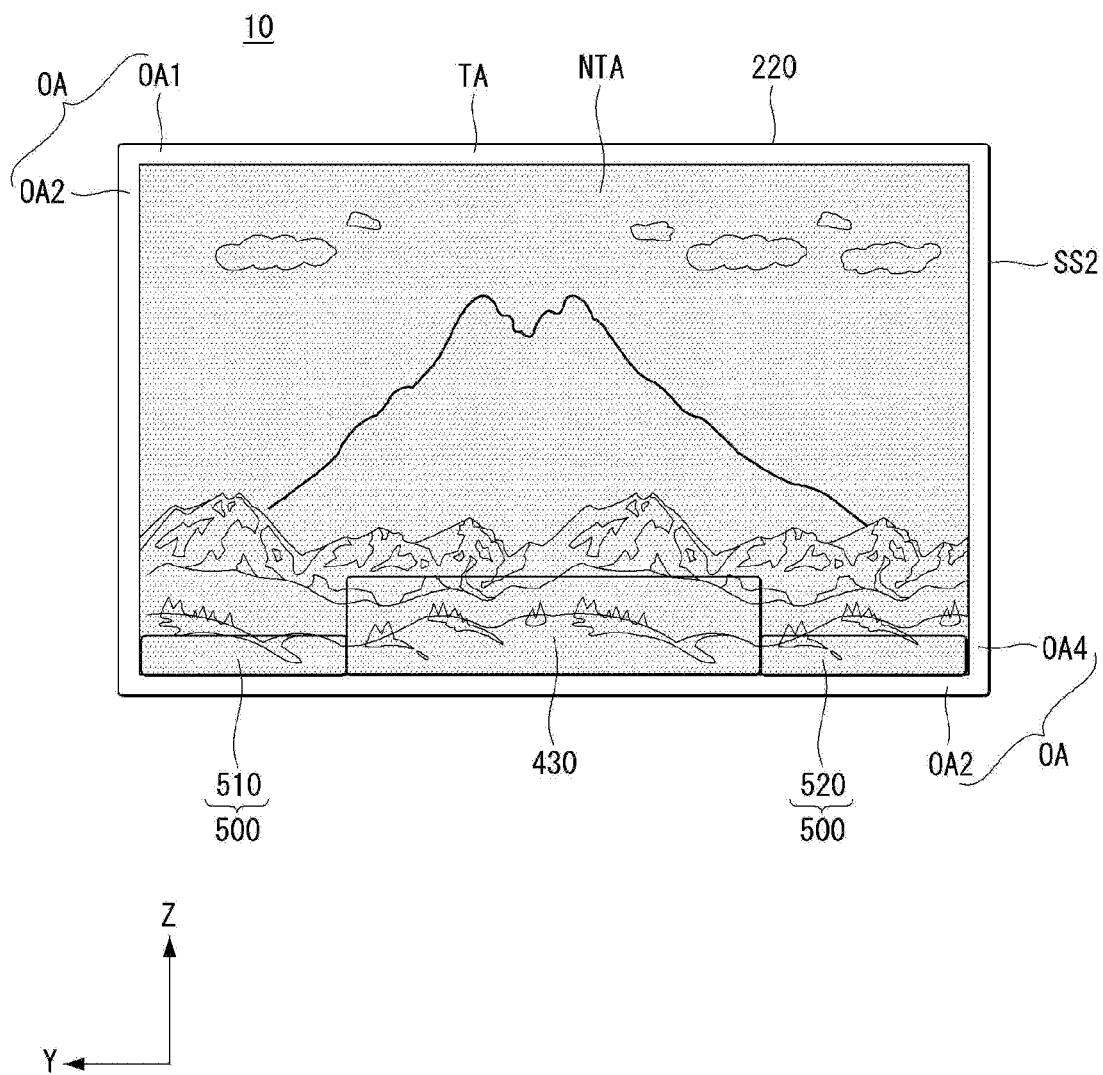

[Figure 20]
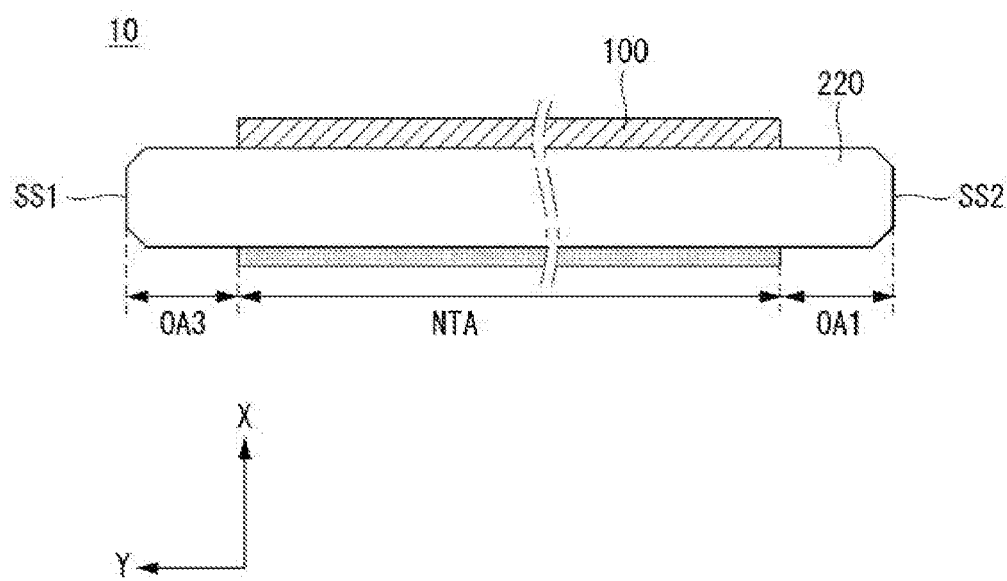

[Figure 21]
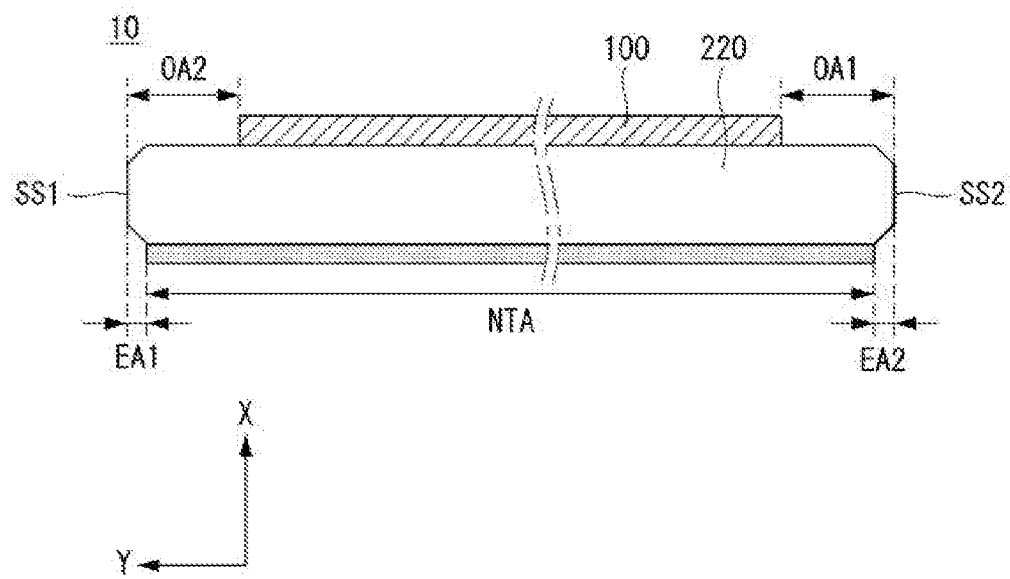

[Figure 22]
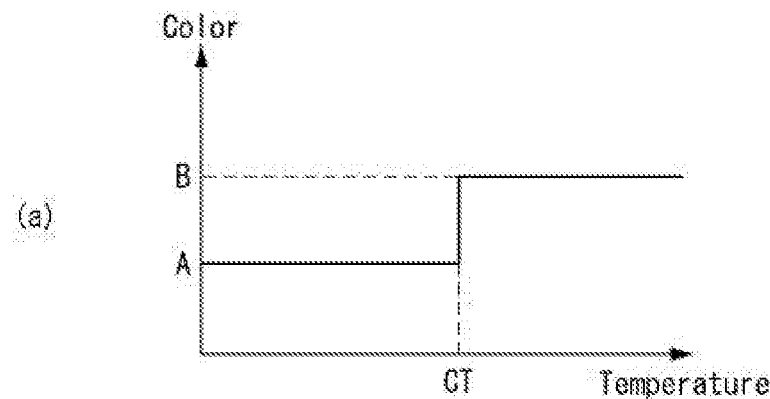
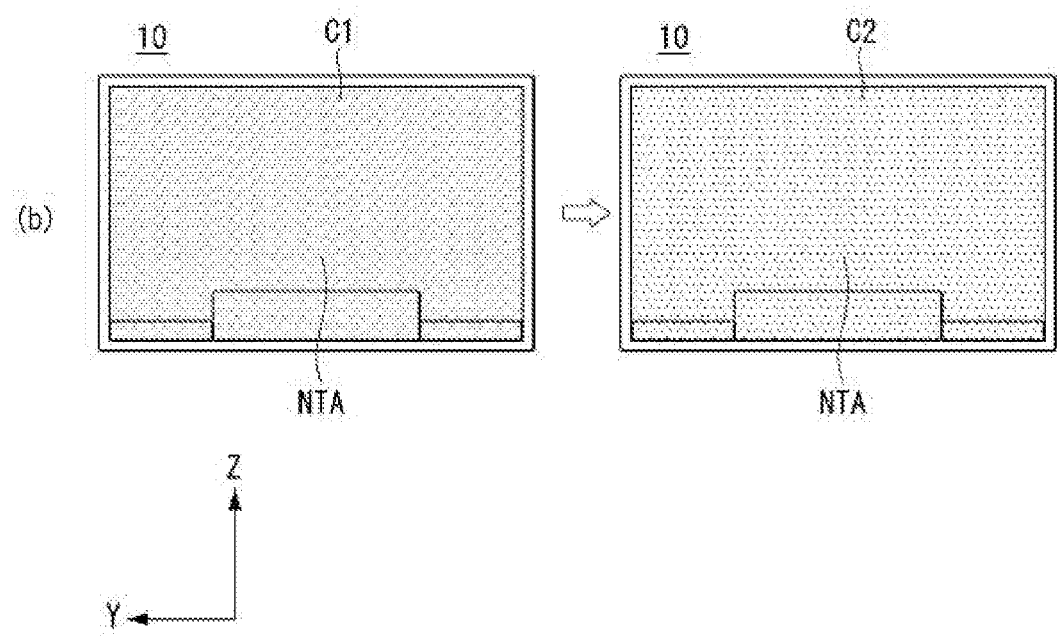

DISPLAY APPARATUS

CROSS-REFERENCE TO RELATED APPLICATION

This application claims priority to and the benefit of Korean Patent Application No. 10-2015-0129555 filed in the Korean Intellectual Property Office on Sep. 14, 2015, the entire contents of which are incorporated herein by reference.

BACKGROUND OF THE INVENTION

Field of the Invention

The present invention relates to a display apparatus and more specifically, a display apparatus in which a display panel and a rear cover can be combined easily.

Related Art

Demands for display apparatus are growing in various forms as the information society is advanced. In response to the demands, various display apparatus such as LCD (Liquid Crystal Display), PDP (Plasma Display Panel), ELD (Electro Luminescent Display), and VFD (Vacuum Fluorescent Display) have been developed and are in wide use.

Among those, a display apparatus utilizing Organic Light Emitting Diode (OLED) exhibits excellent performance in brightness and viewing angle compared with the LCD and can be implemented with an ultra-slim profile since a backlight unit is not required.

Differently from existing display apparatus, rising are demands for improving aesthetic appearance and maximizing utility by keeping the display panel itself to be transparent while the display apparatus is in an inactive state where images are not displayed so that the background behind the rear surface can be seen.

SUMMARY OF THE INVENTION

The present invention aims to solve the technical problem described above and other associated problems. Another object of the present invention is to provide a display apparatus in which a display panel and a rear cover can be combined easily.

A display apparatus according to one aspect of the present invention to achieve the aforementioned technical object or other objects comprises a display panel with which a source PCB is combined in one side; a rear cover disposed in the rear surface side of the display panel; and a housing supporting at least one of the display panel and the rear cover from a lower surface side of the display panel and being equipped with at least one PCB, wherein the rear cover is made of transparent material through which light can pass.

At least one penetrating hole corresponding to at least one area of the source PCB can be formed in at least one area of the rear cover.

The at least one penetrating hole can be formed in a lower part of the rear cover.

A plurality of penetrating holes can be formed, and the plurality of penetrating holes can be separated from each other by partitioning walls.

At least one width of the partitioning wall can differ from at least one the other width of the partitioning wall.

The width of at least one partitioning wall adjacent to a short edge of the rear cover can be wider than the width of at least one penetrating wall formed inside the rear cover.

The height of at least one of the plurality of penetrating holes can differ from the height of at least one of the other penetrating holes.

The width of the rear cover can be larger than the width of the display panel.

The rear cover can include a protruding area protruding from at least one of a long edge and a short edge of the display panel.

At least part of the protruding area can be transparent.

The end of the protruding area can have a plurality of surfaces of which the respective orientations are different from the orientations of the front and the rear surface of the rear cover.

The rear surface of the rear cover can include a non-transparent area including a central area of the rear cover and a transparent area including a peripheral area of the rear cover.

The width of the non-transparent area can be larger than the width of the display panel area.

A material with varying properties according to temperature change can be attached to the non-transparent area.

A light-blocking plate can be further disposed between the display panel and the rear cover, and a light-blocking plate penetrating hole formed at a position corresponding to the at least one penetrating hole can be formed in the light-blocking plate.

At least part of the light-blocking plate can be made of a metallic material.

BRIEF DESCRIPTION OF THE DRAWINGS

FIGS. 1 to 6 illustrate the structure of a display apparatus according to the present invention.

FIGS. 7 and 8 are exploded perspective views of a display apparatus according to various embodiments of the present invention.

FIGS. 9 to 14 illustrate a rear cover of a display apparatus according to one embodiment of the present invention.

FIGS. 15 to 18 illustrate relationships between a rear cover and other structures according to one embodiment of the present invention.

FIGS. 19 to 22 illustrate the structure of a rear cover according to one embodiment of the present invention.

DESCRIPTION OF EXEMPLARY EMBODIMENTS

In what follows, embodiments of the present invention will be described in detail with reference to appended drawings. The same reference number is assigned to those constituting elements which are the same or similar to each other irrespective of their symbols assigned in the corresponding drawings. A suffix such as "module" and "unit" introduced in the description below is assigned merely to facilitate description of this document, and the "module" and "unit" can be used interchangeably; therefore, each individual suffix does not have a distinctive meaning or unique role assigned thereto. Also, in describing an embodiment disclosed in this document, if specific descriptions related to the art known to the public are determined to obscure the technical principles of the embodiment disclosed in this document, the specific descriptions thereof will be omitted. Also, it should be understood that the appended drawings are intended merely to facilitate understanding the embodiments disclosed in this document. Therefore, the technical principles disclosed in this document are not limited by the appended drawings, and it should be understood that what are described with reference to the appended drawings include all the possible modifications, equivalents, or substitutes based on the technical principles of the present invention and belonging to the technical scope of the present invention.

In what follows, it is assumed that a display panel is made of Organic Light Emitting Display (OLED). However, a display panel according to the present invention is not limited to the OLED but also can be implemented by using Liquid Crystal Display (LCD), Plasma Display Panel (PDP), or Field Emission Display (FED).

FIGS. 1 to 6 illustrate the structure of a display apparatus according to the present invention.

With reference to FIG. 1, a display apparatus 10 according to the present invention can comprise a display unit 250 and a housing 300.

The display unit 250 can comprise a display panel 100 and a back cover 200. The display panel 100, being installed on the front surface of the display apparatus 10, can display images. The display panel 100 can display an image by dividing the image into a plurality of pixels and controlling the pixels to emit light according to their individual color, brightness, and saturation.

The display panel 100 can be of a rectangular shape. However, the present invention is not limited to the aforementioned specific shape, but the display panel 100 can be formed such that each corner of the display panel has a round shape with a predetermined radius of curvature. The display panel 100 can be an OLED panel. However, it should be understood that the present invention is not limited to the aforementioned specific type, but the display panel 100 may be made of an LCD panel.

The back cover 200 can be installed on the rear surface of the display panel 100. The back cover 200 can be attached directly to the display panel 10. However, the present invention is not limited to the aforementioned specific configuration, but a third constituting element can be disposed between the back cover 200 and the display panel 100. The size of the back cover 200 can be the same as or larger than that of the display panel 10.

The back cover 200 can support the rear surface of the display panel 100. Accordingly, the back cover 200 can be made of high strength lightweight material.

The housing 300 can be installed in the lower part of the display unit 250. The housing 300 supports the lower part of the display unit 25 so that the display unit 25 does not lean to one side. The whole surface of at least one side of the housing 300 can have a curved shape. Accordingly, the appearance of the display apparatus 10 can be improved.

The housing 300 can shield constituting elements driving the display apparatus 10. For example, the housing 300 can shield at least one PCB. A detailed description about a combination structure of and a method for combining at least one PCB will be given later.

Electromagnetic waves emitted from at least one PCB can be transmitted to the housing 30. Therefore, although not shown in the figure, the housing 30 can be composed of an inner housing made of conductive material and an outer housing enclosing the inner housing. However, the present invention is not limited to the aforementioned configuration, and the housing 30 can be composed of a single conductive material.

With reference to FIG. 2, the display panel 100 can comprise a transparent substrate 110, an upper electrode 120, an organic light emitting layer 130, and a lower electrode 140. The transparent substrate 110, upper electrode 120, organic light emitting layer 130, and lower electrode 140 can be formed sequentially.

The transparent substrate 110 and the upper electrode 120 can be made of transparent materials. The lower electrode 140 may be made of non-transparent material. However, the present invention is not limited to the aforementioned configuration, and the lower electrode 140 may be made of transparent material (for example, ITO). In this case, light can be emitted through one surface of the lower electrode 140.

If voltage is applied to the upper and the lower electrodes 120, 140, the light generated from the organic light emitting layer 130 can be emitted to the outside after passing through the upper electrode 120 and the transparent substrate 110. At this time, to direct the light escaped to the lower electrode 140 back to the front surface, a light-blocking plate may be further installed behind the lower electrode 140.

The display apparatus 100 according to the present invention can be an OLED display apparatus. In this case, no particular light source is required; thus, volume and weight of the display apparatus 100 can be reduced. Also, since the response speed of the OLED display apparatus is more than 1000 times faster than that of an LCD apparatus, an after-image may not be observed when an image is being displayed.

With reference to FIG. 3, the display unit 250 of the display apparatus 10 according to the present invention may include a transparent material. In other words, it indicates that a back cover includes a transparent material. For example, a back cover can include glass or reinforced glass.

When the display apparatus 10 is operated, the user can watch the image or screen displayed on the display unit 250. On the other hand, when operation of the display apparatus 10 is terminated, the user can see the background in the rear of the display unit 250.

The display unit 250 of the display apparatus 10 according to the present invention can be made transparent. Accordingly, the user can feel that the appearance of the display apparatus is clean and tidy.

With reference to FIG. 4, the housing 300 can be composed of a rear surface unit, installation unit, and front surface unit. The installation unit can be the part with which the display unit is combined, and the rear surface unit and front surface unit can correspond to those parts disposed on the rear surface and front surface of the display unit respectively.

The length (FD) along thickness of the front surface unit (for example, x-direction) can be larger than the length (BD) along thickness of the rear surface unit. Since the length (BD) of the front surface is short, the user can focus on the display screen without being occluded by the housing 300.

Since the rear surface unit of the housing 300 can accommodate larger space than other parts, at least one PCB (Printed Circuit Board) can be installed on the rear surface unit of the housing 300. Individual PCBs can be disposed being separated from each other. Each PCB can provide a function different from the others. For example, at least one PCB can be a main board 103. The main board 103 can provide an interface through which the display apparatus can operate properly. Also, the main board 103 checks and manages operation states of the respective components of the display apparatus, thereby keeping the display apparatus to be in an optimal condition. For example, the main board 103 can be installed on at least one side surface of the rear surface unit of the housing.

As another example, at least one PCB can be a power supply 107. The power supply 107 can provide power to the display apparatus. The power supply 107 can convert AC power to DC power. In other words, the power supply 107 can improve electrical efficiency by converting high-frequency power to low-frequency power.

The power supply 107 can be disposed being separated from the main board 103 by a predetermined distance. For example, one power supply 107 can be disposed at the center of the rear surface unit of the housing 300, and another power supply 107 can be disposed at the opposite position of the main board 103 along the length of the housing 300 (for example, y-direction). However, the present invention is not limited to the description above, and only one power supply 107 may be positioned at the central part thereof.

As a yet another example, at least one PCB can be a timing controller board 121. The timing controller board 121 can provide an input signal to the display panel. In other words, the timing controller board 121 can provide timing signals (CLK, LOAD, SPi) controlling a source PCB and a video signal (R, G, B) to the source PCB. Also, the timing controller board 121 can control an image. The timing controller board 105 can be connected to the source PCB 120 through an FFC cable.

The timing controller board 121 can be positioned at the central part of the rear surface unit of the housing 300. In other words, the timing controller board 121 can be installed on the upper surface of the power supply 107. Since the timing controller board 121 can be positioned at the upper surface of the power supply 107, the inner space of the housing 300 can be saved.

To prevent electromagnetic waves emitted from the power supply 107, a t-con shield 113 can be attached to the position where the timing controller board 121 is installed. In other words, it indicates that the timing controller board 121 can be combined on the t-con shield 113 rather than the power supply 107. Accordingly, the power supply 107 and the timing controller board 121 may not interfere with each other.

With reference to FIG. 5, a light-blocking plate 172 can be positioned between the display panel 100 and the back cover 200. The light-blocking plate 172 can reflect the light coming out to the back cover 200 to direct the light to the front surface of the display panel 100. By doing so, the light-blocking plate 172 can increase brightness of the display panel 100.

The light-blocking plate 172 blocks light when the display panel 100 is being driven, in other words, when the display panel 100 displays the screen, while the light-blocking plate 172 allows light to pass through it when the display panel 100 is not driven. This mechanism can be varied according to the arrangement of liquid crystal inside the light-blocking plate 172.

The light-blocking plate 172 can be made of a material having a thermal expansion coefficient different from the display panel 100. For example, the light-blocking plate 172 can include a material having a thermal expansion coefficient larger than that of the display panel 100. Therefore, the light-blocking plate 172 can be expanded further than the display panel 100 in a high-temperature or high-humidity condition. In this regard, to prevent the light-blocking plate 172 from being exposed to the outside of the display panel 100, the height of the light-blocking plate 172 can be made to be lower than the display panel 100.

In the display apparatus according to the present invention, the light-blocking plate 172 can be installed on the rear surface of the display panel 100. Accordingly, when the display panel 100 displays a screen, the user can enjoy the screen with more clarity.

With reference to FIG. 6, as described in detail above, since the height of the light-blocking plate 172 is lower than that of the display panel 100, foreign substance such as dust can come into the gap between them. Also, a crack can be formed on the exposed light-blocking plate 172 and the upper surface of the display panel 100.

To prevent the aforementioned things from being occurred, for example, the upper surface of the light-blocking plate 172 and the upper surface of the display panel 100 can be side sealed with a sealing member 183. The sealing member 183 can shield the upper surface of the light-blocking plate 172 and the upper surface of the display panel 100 at the same time.

As another example, a frame 187 can be inserted into the upper surface of the light-blocking surface 172. The frame 187 can touch the upper surface of the light-blocking plate 172 and extend toward the display panel 100 (for example, x-direction). Accordingly, the frame 187 can be separated from the display panel 100, thereby shielding the upper surface of the display panel 100.

In the display apparatus according to the present invention, the upper surfaces of the light-blocking plate 172 and the display panel 100 can be shielded by a sealing member 183 or a frame 187. Accordingly, the upper surfaces of the light-blocking plate 172 and the display panel 100 can be protected.

FIGS. 7 and 8 are exploded perspective views of a display apparatus according to various embodiments of the present invention.

As shown in the figures, a display apparatus 10 according to an embodiment of the present invention can include a rear cover 200. At least part of the rear cover 200 can be made of a material which allows light to pass through it. At least part of the rear cover 200 can be composed of glass material. In at least part of the rear cover 200, penetrating holes 220 can be formed, through which a source PCB 120 combined with the display panel 100 can be combined with the rear cover 200. By employing the rear cover 200 according to one embodiment of the present invention, improved competitiveness due to design differentiation with respect to other products can be expected. Also, by employing the rear cover 200 according to one embodiment of the present invention, stiffness required for the whole of the display apparatus 10 can be obtained in an effective manner.

As shown in FIG. 7, the display apparatus 10 according to one embodiment of the present invention can comprise a display panel 100, a rear cover 200 disposed at the rear surface of the display panel 100, and an AV box 400 disposed at the rear surface of the rear cover 200. In the lower part of the display panel 100, a housing (300 of FIG. 1) equipped with PCBs required for operating the display apparatus 100 may be installed.

The display panel 100 can be the part which actually displays an image. The display panel 10 of the display apparatus 10 according to one embodiment of the present invention can be of OLED type. In other words, it indicates that the panel itself emits light, thereby enabling viewing an image without using a backlight unit. By employing the display panel 10 of OLED type, the backlight unit can be obviated; therefore, thickness of the display apparatus 10 can be made thin. At the rear surface of the display panel 100, a source PCB 120 can be disposed.

The source PCB 120 can function as a path through which an electrical signal is sent to the electrode of the display panel 100. The source PCB 120 can be disposed on a signal path connecting the display panel 100 to other electronic components of the display apparatus 10.

The source PCB 120 can be installed on the rear surface of the display panel 100. For example, it indicates that the source PCB 120 can be installed in the lower part of the display panel 100. The lower part of the display panel 100 in which the source PCB 120 is installed can be disposed inside the housing (300 of FIG. 1).

The rear cover 200 can be combined with the display panel 100. The rear cover 200 can be attached to the front of the rear surface of the display panel 100. The rear cover 200 attached to the display panel 100 can provide enough stiffness by which the display panel 100 can maintain the shape originally designed. For example, the display panel 100 can be made of a flexible material, but due to the rear cover 200 made of a rigid material, the shape of the display panel 100 can be maintained. Penetrating holes 220 can be formed in the rear cover 200.

At least part of the rear cover 200 can be made of a transparent material. The whole of the rear cover 200 can be made of a transparent material. A transparent material can denote such a material which does not completely block light. In other words, except for the case where light penetration ratio is 0%, the transparent material can range from the case of 100% light penetration ratio to the case of a translucent material which allows only a predetermined amount of light to penetrate.

The whole or part of the rear cover 200 can be made of glass. The rear cover 200 made of glass material can exhibit transparency. The rear cover 200 of glass material can provide stiffness to support the display panel 100. The rear cover 200 of glass material can be effectively utilized to provide a differentiated design.

Penetrating holes 220 can be formed in at least part of the rear cover 200. The penetrating holes 220 can be formed through processing of the rear cover 200 of glass material. The penetrating holes 220 can be grouped into a plurality of areas.

The penetrating holes 220 can be formed at those positions corresponding to the source PCB 120 attached to the display panel 100. The source PCB 120 can be combined with the penetrating holes 220. The source PCB 120 attached to the rear surface of the display panel 100 can extend toward the rear cover 200. Due to the source PCB 120 protruding toward the rear cover 200, the display panel 100 and the rear cover 200 can be prevented from being combined together. The penetrating holes 220 allow the source PCB 120 protruding from the rear surface of the display panel 100 to pass through the penetrating holes so that the display panel 100 and the rear cover 200 can be combined easily. A shielding cover 500 can be attached to the penetrating holes 220.

At least one shielding cover 500 can be used. For example, a first and a second shielding cover 510, 520 are attached to the respective penetrating holes 220, thereby preventing the penetrating holes 220 from being exposed directly to the outside. In other words, it indicates that the shielding cover 500 is made of a material and/or a shape the same as or similar to that of the rear cover 200 so that the shielding cover 500 can be perceived to seamlessly integrate into the rear cover 200 when viewed from the rear surface of the electronic device 10.

An AV box 400 can be disposed at the rear surface of the rear cover 200. The AV box 400 can be combined through at least one assembly hole 240 formed in the rear cover 200.

The AV box 400 can comprise an assembly plate 410, first cover 420, and second cover 430.

The assembly plate 410 can be the part which actually touches the rear cover 200. In other words, it indicates that the protruding part of the assembly plate 410 can be combined with the rear cover 200 as it is inserted to the assembly hole 240 of the rear cover 200.

At least one stiffness reinforced rib 412 can be formed in the assembly plate 410 along horizontal and/or vertical direction. For example, it indicates that a concave and convex structure can be formed in the assembly plate 410 itself or ribs can be attached to the assembly plate 410. Due to the stiffness reinforced rib 412, stiffness of the assembly plate 410 can be secured by more than a predetermined degree. The stiffness of the assembly plate 410 can influence on the stiffness of the rear cover 200.

The first and the second cover 420, 430 can be combined with each other on the assembly plate 410. For example, it indicates that the first cover 420 can be attached to the assembly plate 410 and the second cover 430 can be attached to the first cover 420. Due to the first and the second cover 420, 430, an accommodating space can be formed inside the AV box 400. In the accommodating space, various devices required for operating the display apparatus 10 can be installed.

FIG. 8 illustrates a display apparatus 10 according to another embodiment of the present invention. As shown in the figure, another structure can be formed between the display panel 100 and the rear cover 200. For example, a light-blocking plate 172 can be disposed between the display panel 100 and the rear cover 200.

The light-blocking plate 172 can be utilized in various ways. For example, in case the light-blocking plate 172 is made of a metallic material, the light-blocking plate 172 can be used to disperse heat generated at the display panel 100. In this case, the light-blocking plate 172 can be made of aluminum material which exhibits a high heat conductivity.

Light-blocking plate penetrating holes 174 can be formed in the light-blocking plate 172. The light-blocking plate penetrating hole 174 can be disposed at the position corresponding to the penetrating hole 220 of the rear cover 200 and/or be of the size corresponding thereto. Or the size of the light-blocking plate 172 may be smaller than that of the display panel 100. For example, it indicates that the light-blocking plate 172 may not extend up to the position of the source PCB 120 of the display panel 100. In this case, the light-blocking plate 172 may not need a separate light-blocking plate penetrating hole 174.

FIGS. 9 to 14 illustrate a rear cover of a display apparatus according to one embodiment of the present invention.

As shown in FIG. 9, in the rear cover 200 of the display apparatus 10 according to one embodiment of the present invention, a plurality of penetrating holes 220 and partitioning walls 230 adjacent to the penetrating holes 220 can be formed.

The penetrating holes 220 can include a first to third penetrating hole 222, 224, 226. For example, the first to the third penetrating hole 222, 224, 226 can be disposed being adjacent to each other. In other words, the second penetrating hole 224 can be disposed next to the first penetrating hole 222, and the third penetrating hole 226 can be disposed next to the second penetrating hole 224.

The partitioning walls 230 can include a first to a fourth partitioning wall 232, 234, 236, 238. For example, the partitioning walls can include the first partitioning wall 232 between the first penetrating hole 222 and a first short edge SS1; the second partitioning wall 234 between the first penetrating hole 222 and the second penetrating hole 224; the third partitioning wall 236 between the second penetrating hole 224 and the third penetrating hole 226; and the fourth partitioning wall 238 between the third penetrating hole 226 and a second short edge SS2.

As shown in FIG. 10, due to the penetrating hole 220, the display panel 100 and the rear cover 200 can be combined easily with each other irrespective of the source PCB 120.

As shown in FIG. 10(a), the source PCB 120 can be disposed in the rear surface of the display panel 100. The source PCB 120 can protrude as much as a first thickness T1. The light-blocking plate 172 can have second thickness T2 while the rear cover 200 can have third thickness T3. The first thickness T1 can be larger than the sum of the second T2 and the third thickness T3. Therefore, if the apparatus is assembled without considering the source PCB 120, the rear cover 200 may not be assembled normally. The source PCB 120 can be positioned to correspond to the light-blocking plate penetrating hole 174 and the penetrating hole 220.

As shown in FIG. 10(b), the source PCB 120 can be assembled through the penetrating hole 220. The source PCB 120 combined with the penetrating hole 220 can extend from the rear surface of the rear cover 200 further to the rear side.

A shielding cover 500 can be attached to the source PCB 120 inserted into the penetrating hole 220. In other words, it indicates that the source PCB 120 can be disposed at the receiving unit 521 inside the shielding cover 500. Therefore, the source PCB 120 can be made to be prevented from being exposed to the outside.

The outer surface of the shielding cover 500 can be made of the same material as the rear cover 200 or the material similar to that for the rear cover 200. Therefore, despite the fact that the shielding cover 500 is combined with the rear cover 200, the whole rear surface can retain a consistent design.

As shown in FIG. 11, the rear cover 200 can be divided into a plurality of areas. For example, the rear cover 200 can be divided into an upper area (UA) and a down area (DA) with respect to a virtual centerline. The penetrating holes 220 can be disposed in the down area (DA).

The down area (DA) can be further divided into an upper down area (DAU) and a lower down area (DAD). The penetrating holes 220 can be disposed in the lower down area (DAD).

As described above, the position of the penetrating hole 220 can correspond to the position of the source PCB 120. As described above, in the display apparatus 100 according to one embodiment of the present invention, electronic devices required for operating the display apparatus 100 can be disposed inside the housing 300 disposed in the lower part of the display apparatus 100. Therefore, electrical wiring should be installed to connect the housing in the lower part of the display apparatus 100 to the display panel 100 in the upper part of the display apparatus 100. The source PCB 120 can be disposed in the lower down area (DAD) of the display panel 100, which lies on the path connecting the housing 300 in the lower part of the display apparatus 100 to the display panel 100 in the upper part of the display apparatus 100. Therefore, the penetrating holes 220 prepared at the positions corresponding to the source PCB 120 can also be disposed at the corresponding areas.

As shown in FIG. 12, the first to the third penetrating hole 222, 224, 226 can be formed with a first to a third penetrating width HW1, HW2, HW3, respectively. The second penetrating width HW2 of the second penetrating hole 224 can be larger than the first HW1 and the third penetrating width HW3 of the first 222 and the third penetrating hole 226.

The first to the fourth partitioning wall 232, 234, 236, 238 can be formed to have a first to a fourth partitioning wall width W1, W2, W3, W4, respectively. The first W1 and the fourth partitioning wall width W4 can be larger than the second W2 or the third partitioning wall width W3. Therefore, the possibility that the first and the fourth partitioning wall 232, 238 are damaged when an external impact is applied can be reduced.

As shown in FIGS. 13 and 14, the penetrating holes 220 can be formed in various ways.

As shown in FIG. 13(a), the penetrating hole 220 can be formed as a non-partitioned single hole. For example, the penetrating hole 220 can be formed along the second long edge LS2 of the rear cover 200.

As shown in FIG. 13(b), penetrating holes 220 with different heights from each other can be formed. For example, it indicates that a first penetrating hole 222 has a first height H1 while a second penetrating hole 224 has a second height H2. The second height H2 can be larger than the first height H1. The penetrating holes 220 can be advantageous for dispersing heat generated from the source PCB 120. In other words, heat can be easily dispersed through the second penetrating hole 224 formed with a height larger than those of the others.

As shown in FIG. 14(a), the penetrating holes 220 can be arranged in the form of a plurality of columns. For example, a first and a third penetrating holes 222, 226 can be disposed in a first column, and a second penetrating hole 224 can be disposed in a second column. In a vertical direction, at least part of the first and the third penetrating hole 222, 226 can overlap the second penetrating hole 224.

As shown in FIG. 14(b), the penetrating holes 220 can be arranged in the form of a plurality of columns, and each column can consist of a plurality of penetrating holes. For example, a first penetrating hole group 220a including the first, second, and third penetrating hole 222, 224, 226 can be disposed in the first column, while a second penetrating hole group 220b including the fourth and fifth penetrating hole 221, 223 can be disposed in the second column.

FIGS. 15 to 18 illustrate relationships between a rear cover and other structures according to one embodiment of the present invention.

As shown in the figures, the rear cover 220 and the display panel 100 can be made of different sizes.

As shown in FIG. 15, the rear cover 220 of the display apparatus 10 can be formed to be larger than the display panel 100. For example, it indicates that the rear cover 220 can have a protruding part (OA) extended from the display panel 100 by as much as the protrusion length (HOA) with reference to the upper side of the display apparatus 10.

The display panel 100 can include a panel 102 and a protection layer 105 disposed on the front surface of the front panel. A light-blocking plate 172 can be disposed between the display panel 100 and the rear cover 220. The rear cover 220 can extend from the display panel 100 and the light-blocking plate 172 by as much as the protrusion length (HOA).

As shown in FIG. 16, a first to a fourth protruding part (OA1 to OA4) can be disposed outside the display panel 100 when the display apparatus 10 is viewed from the front. For example, it indicates that a first protruding part OA1 can be disposed along a first long edge LS1; a second protruding part OA2 along a second long edge LS2; a third protruding part OS3 along a first short edge SS1; and a fourth protruding part OA4 along a second short edge SS2.

The first, second, third, and fourth protruding part (OA1 to OA4) can be transparent. As described above, the rear cover 220 can be made of glass. The glass can be transparent. Therefore, the first, second, third, and fourth protruding part (OA1 to OA4), which are protruding relatively from the display panel 100, can be seen to be transparent differently from the inner area (IA) in which the display panel 100 is disposed.

As shown in FIG. 17, a first, third, and fourth protruding part OA1, OA3, OA4 can be disposed in the outside of the display panel 100. In other words, it indicates that a protruding part may not exist along the second long edge (LS2) of the display panel 100. In other words, a protruding part may not exist in the housing assembly area of the lower part of the display panel 100.

As shown in FIG. 18, the protruding part OA can be implemented in various forms.

As shown in FIG. 18(a), a beveling process can be applied to the end of the protruding part (OA). In other words, the end of the protruding part (OA) can have a plurality of surfaces not parallel to the front and rear surface of the rear cover 220. To put differently, the end of the protruding part (OA) includes a plurality of surfaces with different orientation angles. For example, an upper flat area (PA) and upper slope areas (IA1, IA2) can be formed. The upper slope area (IA1, IA2) can be formed in one and the other side of the upper flat area (PA). The end of the protruding area (OA) to which a beveling process has been applied can reflect external light to a particular direction. Therefore, even when an additional lighting source is not employed, the end of the protruding part (OA) can be made to shine naturally, thereby improving aesthetical value.

One area of the protruding part (OA) can exhibit a different reflectance from the other area. For example, it indicates that the upper flat area (PA) and/or upper slope areas (IA1, IA2) can show reflectance different from the vertical area (VA). For example, the reflectance of the upper flat area (PA) and/or upper slope areas (IA1, IA2) can be larger than that of the vertical area (VA). Therefore, even with the same amount of light, the end of the protruding part (OA) can shine more brightly.

As shown in FIG. 18(b), the end of the protruding part (OA) can include an upper slope area (IA) in one orientation. In other words, it indicates that the protruding part (OA) can have only a sloped area without a flat area. In this case, due to a large upper slope area (IA) in one orientation, the amount of light reflected to the front of the user can become abundant. Therefore, the protruding part (OA) can be perceived more clearly.

As shown in FIG. 18(c), the end of the protruding part (OA) can be processed to form a round shape (RA). The round-shaped end (RA) cannot be easily damaged by external impact. Also, by illuminating light uniformly on the protruding part (OA), the end of the protruding part (OA) can be perceived to glow gently.

FIGS. 19 to 22 illustrate the structure of a rear cover according to one embodiment of the present invention.

As shown in the figures, at least part of the rear surface of the rear cover 220 can be processed differently from other areas. For example, a predetermine pattern can be deposited on the rear surface of the rear cover 220. For example, tape with a predetermined pattern can be attached to the rear surface of the rear cover 220.

As shown in FIG. 19, if viewed from the rear of the display apparatus 10, at least part of the rear cover 220 can be non-transparent (NTA). For example, the area except for the protruding part (OA) can be made non-transparent (NTA).

The non-transparent area (NTA) can include a third cover 430 and/or shielding cover 500 attached to the rear side of the display apparatus 10. In other words, when viewed from the rear of the display apparatus 10, substance of similar material can be deposited on and/or attached to a significant portion of the rear surface of the display apparatus 10.

Non-transparent substance can be applied to the non-transparent area (NTA) through a deposition process. Non-transparent tape can be attached to the non-transparent area (NTA).

The non-transparent area (NTA) can include a predetermined pattern and/or shape. For example, a drawing that the user of the display apparatus 10 prefers can be applied to the non-transparent area (NTA). Therefore, an interior design by using the display apparatus 10 can be made possible.

As shown in FIG. 20, the non-transparent area (NTA) can include the central area of the rear cover 220. For example, the area excluding a first and a second protruding area (OA1, OA2) can correspond to a non-transparent area (NTA). In this case, the user at the front of the display apparatus 10 can see the transparent, first and second protruding area (OA1, OA2).

As shown in FIG. 21, the non-transparent area (NTA) can be further extended toward the first and second protruding part (OA1, OA2). Therefore, only the first and the second end (EA1, EA2) of the first and the second protruding part (OA1, OA2) of the rear cover 220 can remain to be transparent. Therefore, the transparent, first and second end (EA1, EA2) can be more emphasized.

As shown in FIG. 22, the substance attached to and/or deposited on the non-transparent area (NTA) can respond to temperature change.

As shown in FIG. 22(a), the substance can change its color from A to B with respect to a threshold temperature (CT). Or the substance can change its color gradually from A to B with respect to the threshold temperature (CT).

As shown in FIG. 22(b), the non-transparent area (NTA) can be deposited initially with a first pattern (C1). The pattern can be formed by at least one of a specific form and a specific color. For example, if the non-transparent area (NTA) is at the room temperature or at a temperature similar to the room temperature as the display apparatus 10 is not being used for a while, the non-transparent area (NTA) can be expressed by A color.

If the display apparatus 10 is operated and the temperature rises above the room temperature by a predetermined degree, the first pattern C1 can be changed to the second pattern C2. For example, it indicates that the color for the non-transparent area (NTA) can change from A to B. The pattern change as described above allows the display apparatus 10 to be used as an interior accessory.

The detailed descriptions above should not be interpreted in a restrictive manner in all aspects, but should be understood to serve as exemplary implementation of the present invention. The technical scope of the present invention should be determined by reasonable interpretation of appended claims. And it should be understood that all of the modifications within the equivalent scope of the present invention belong to the technical scope of the present invention.

The advantageous effects of a display apparatus according to the present invention can be described as follows.

According to at least one of the embodiments of the present invention, a display panel and a rear cover can be combined easily with each other.

The additional technical scope of the present invention can be clearly understood from detailed descriptions given below. However, since various changes and modifications made within the technical principles and scope of the present invention can be clearly understood by those skilled in the art, detailed descriptions of the present invention and specific embodiments such as preferred embodiments of the present invention should be understood as being provided merely as examples.

What is claimed is:

1. A display apparatus, comprising:
    a display panel having a display area on a front surface;
    a printed circuit board (PCB) positioned on a rear surface of the display panel and opposite to the display area;
    a rear cover disposed at the rear surface of the display panel; and
    a housing supporting at least one of the display panel and the rear cover,
    wherein at least one penetrating hole is disposed at the rear cover corresponding to an area of the display panel in which the PCB is disposed.

2. The display apparatus of claim 1, wherein the at least one penetrating hole is disposed at a lower part of the rear cover.

3. The display apparatus of claim 1, wherein a plurality of penetrating holes are disposed at the rear cover, and the plurality of penetrating holes are separated from each other by partitioning walls in the rear cover.

4. The display apparatus of claim 3, wherein a width of one partitioning wall differs from a width of another partitioning wall.

5. The display apparatus of claim 4, wherein the width of the partitioning wall adjacent to a short edge of the rear cover is wider than the width of the partitioning wall disposed further away from the short edge of the rear cover.

6. The display apparatus of claim 3, wherein a height of one penetrating hole differs from a height of another penetrating hole.

7. The display apparatus of claim 1, wherein the rear cover is larger than the display panel.

8. The display apparatus of claim 7, wherein the rear cover includes an area protruding from at least one of a long edge and a short edge of the display panel.

9. The display apparatus of claim 8, wherein at least part of the protruding area of the rear cover is transparent.

10. The display apparatus of claim 8, wherein an end portion of the protruding area of the rear cover includes a plurality of surfaces which have different orientations with respect to each other.

11. The display apparatus of claim 8, wherein an end portion of the protruding area of the rear cover is sloped to have one orientation.

12. The display apparatus of claim 1, wherein a surface of the rear cover includes a non-transparent area including a central area of the rear cover and a transparent area including a peripheral area of the rear cover.

13. The display apparatus of claim 12, wherein a width of the non-transparent area of the rear cover is at least a width of the display panel.

14. The display apparatus of claim 12, wherein the non-transparent area of the rear cover includes a material having a property that varies according to temperature change.

15. The display apparatus of claim 1, further comprising a light-blocking plate disposed between the display panel and the rear cover, wherein a light-blocking plate includes a penetrating hole disposed at a position corresponding to the at least one penetrating hole disposed at the rear cover.

16. The display apparatus of claim 15, wherein at least part of the light-blocking plate is made of a metallic material.

17. The display apparatus of claim 15, wherein the light-blocking plate blocks light when the display panel is driven and allows light to pass through when the display panel is not driven.

18. The display apparatus of claim 15, wherein a height of the light-blocking plate is lower than a height of the display panel, the display apparatus further comprising at least one of a sealing member or a frame disposed at an upper surface of the light-blocking plate.

19. The display apparatus of claim 1, further comprising a shield cover covering the at least one penetrating hole disposed at the rear cover.

* * * * *